United States Patent
Gaspard et al.

(10) Patent No.: US 9,768,757 B1
(45) Date of Patent: Sep. 19, 2017

(54) REGISTER CIRCUITRY WITH ASYNCHRONOUS SYSTEM RESET

(71) Applicant: Altera Corporation, San Jose, CA (US)

(72) Inventors: Nelson Joseph Gaspard, Nashville, TN (US); Wen Wu, Sunnyvale, CA (US); Yanzhong Xu, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 15/177,004

(22) Filed: Jun. 8, 2016

(51) Int. Cl.
*H03K 3/356* (2006.01)
*H03K 3/3562* (2006.01)
*H03K 3/037* (2006.01)

(52) U.S. Cl.
CPC ....... *H03K 3/35625* (2013.01); *H03K 3/0372* (2013.01)

(58) Field of Classification Search
CPC .......................... H03K 3/35625; H03K 3/0372
USPC ......................................................... 327/208
See application file for complete search history.

(56) References Cited

U.S. PATENT DOCUMENTS

| | | | |
|---|---|---|---|
| 5,488,319 A | 1/1996 | Lo et al. | |
| 6,624,677 B1* | 9/2003 | Wissel | H03K 3/0372 327/202 |
| 7,425,855 B2* | 9/2008 | Chen | H03K 3/0375 327/202 |
| 8,564,337 B2 | 10/2013 | Block et al. | |
| 8,812,893 B1* | 8/2014 | Venkata | H03K 21/38 327/115 |
| 8,887,019 B2 | 11/2014 | Chakravadhanula et al. | |
| 9,197,211 B2 | 11/2015 | Venas et al. | |
| 9,344,067 B1 | 5/2016 | Wu | |
| 2004/0233701 A1* | 11/2004 | Turner | G11C 11/4125 365/154 |
| 2010/0254069 A1* | 10/2010 | Shaw | G11C 11/4125 361/301.1 |
| 2012/0240091 A1* | 9/2012 | Sunder | G06F 1/10 716/113 |
| 2012/0268181 A1* | 10/2012 | Fujimaki | H03L 7/10 327/158 |
| 2013/0049820 A1* | 2/2013 | Ide | H03K 21/12 327/115 |
| 2014/0070865 A1* | 3/2014 | Fortier | G06F 1/24 327/296 |

* cited by examiner

*Primary Examiner* — Ryan Jager
(74) *Attorney, Agent, or Firm* — Treyz Law Group, P.C.; Jason Tsai

(57) ABSTRACT

Integrated circuits having flip-flops with asynchronous reset capabilities are provided. The flip-flops may be single event upset (SEU) hardened registers implemented using dual-interlocked cell (DICE) latch circuits. A logic gate may be inserted at the data input of each flip-flop. A multiplexer may be inserted at the input of the clock tree that is being used to feed clock signals to each of the flip-flops. Both the logic gate and the multiplexer may receive an asynchronous reset signal. The multiplexer may also receive a normal clock signal and a delayed clock pulse signal that is triggered in response to detecting assertion of the reset signal.

13 Claims, 6 Drawing Sheets

US 9,768,757 B1

REGISTER CIRCUITRY WITH ASYNCHRONOUS SYSTEM RESET

BACKGROUND

This relates to integrated circuits, and more particularly, to integrated circuits with storage elements that demonstrate soft error upset immunity.

Integrated circuits often contain volatile storage elements. Typical volatile storage elements may be based on cross-coupled inverters (latches). A volatile storage element retains data only so long as the integrated circuit is powered. In the event of power loss, the data in the volatile storage element is lost. Although nonvolatile storage elements such as memory elements based on electrically-erasable programmable read-only memory technology are not subject to data loss in this way, it is often not desirable or possible to fabricate nonvolatile storage elements as part of an integrated circuit.

As a result, volatile storage elements are often used. For example, a volatile storage element such as a flip-flop circuit includes a master latch and a slave latch, where each of the master and slave latches includes a pair of cross-coupled inverters. Such types of volatile storage elements are subject to a phenomenon known as soft error upset.

Soft error upset (SEU) events are caused by cosmic rays and radioactive impurities embedded in integrated circuits and their packages. Cosmic rays and radioactive impurities generate high-energy atomic particles such as neutrons and alpha particles. The storage elements contain transistors and other components that are formed from a patterned silicon substrate. When an atomic particle strikes the silicon in the storage element, electron-hole pairs are generated. The electron-hole pairs create a conduction path that can cause a charged node in the storage element to discharge and the state of the storage element to flip. If, for example, a logic "1" was stored in the storage element, a soft error upset event could cause the "1" to change to a logic "0."

Upset events in an integrated circuit corrupt the data stored in the storage elements and can have serious repercussions on system performance. In certain system applications such as remote installations of telecommunications equipment, it is extremely burdensome to repair faulty equipment. Unless integrated circuits demonstrate good immunity to soft error upset (SEU) events, they will be unsuitable for these types of applications.

It may therefore be desirable to provide storage elements such as registers with SEU immunity.

SUMMARY

This relates generally to integrated circuits and, more particular, to integrated circuits having registers with asynchronous system reset capabilities.

In accordance with an embodiment, an integrated circuit may include a register (e.g., a hardened flip-flop that is resistant to soft error upsets), a clock tree that supplies a control signal to the register, and a switching circuit having inputs that receive a normal clock signal and an asynchronous reset signal (e.g., a reset signal that is not necessarily in sync with the normal clock signal) and an output that is coupled to the clock tree.

The switching circuit may be a multiplexer having a control input that receives the reset signal, a first input that receives the clock signal, and a second input that receives a delayed version of the reset signal. A delay circuit and a pulse generator circuit may be connected in series to the second input of the multiplexer. The pulse generator may be configured to generate a clock pulse signal in response to detecting an edge in the reset signal.

A logic gate (e.g., a logic AND gate) may also be inserted at the data input of the register. In particular, the logic gate may have a first input that receives user data from combinational logic, a second input that receives the asynchronous reset signal, and an output that selectively provides a reset value to the register when the reset signal is asserted (e.g., when the reset signal is driven low).

Further features of the invention, its nature and various advantages will be more apparent from the accompanying drawings and following detailed description.

DETAILED DESCRIPTION

This relates to integrated circuits with storage elements that are resistant to soft error upset events and that are provided with asynchronous system reset capabilities.

In accordance with some embodiments, a logic gate may be inserted at the data input of each storage element, each storage element may receive a control signal via a clock tree, and a multiplexing circuit may be inserted at the input of the clock tree. The multiplexing circuit may be controlled by a reset signal and may receive either a clock signal or a delayed version of the reset signal. It will be recognized by one skilled in the art, that the present exemplary embodiments may be practiced without some or all of these specific details. In other instances, well-known operations have not been described in detail in order not to unnecessarily obscure the present embodiments.

In general, storage elements can be used in any suitable integrated circuits that require storage of data. These integrated circuits may be memory chips, digital signal processing chips, microprocessors, application specific integrated circuits (ASIC), application specific standard products (ASSPs), programmable integrated circuits, or other suitable type of integrated circuits.

Figure 1:
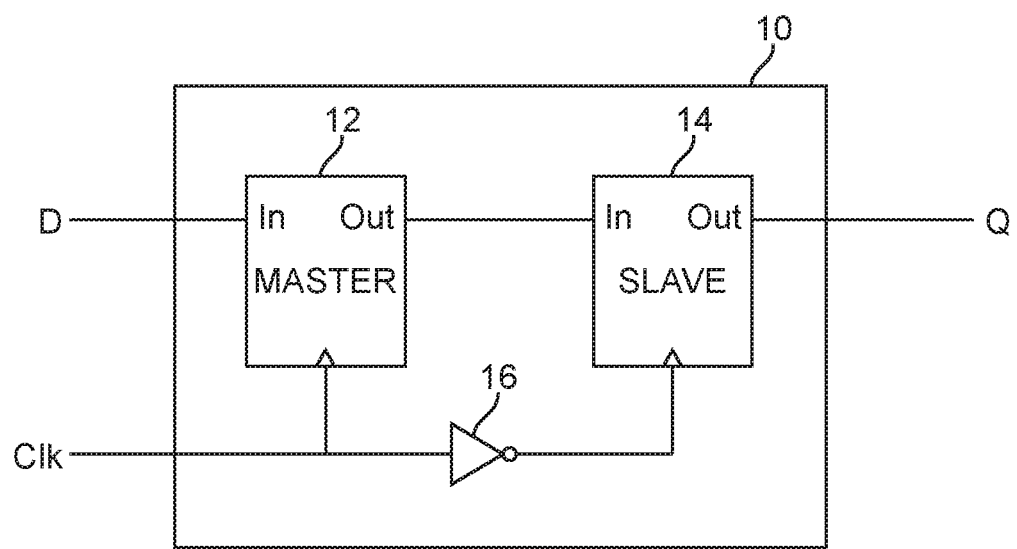
FIG. 1 is a diagram of an illustrative clocked storage element in accordance with an embodiment of the present invention.

In one embodiment, an integrated circuit may include a storage element such as clocked storage element 10 (see, e.g., FIG. 1). As shown in FIG. 1, clocked storage element 10 may include a data input terminal (e.g., an input terminal that receives a data input signal D), and data output terminal (e.g., an output terminal on which data output signal Q is generated), and a control input terminal (e.g., an input terminal that receives control signal Clk). Clocked storage element 10 may include latching circuits such as master latch circuit 12 and slave latch circuit 14 coupled in series between the data input terminal and data output terminal.

Master latch 12 and slave latch 14 may each have an input terminal (In), an output terminal (Out), and a control input. The input terminal of master latch 12 may receive data input signal D. The output of master latch 12 may be coupled to the input of slave latch 14. Data output signal Q may be generated at the output of slave latch 14. The control input of master latch 12 may receive signal Clk, whereas the control input of slave latch 12 may receive an inverted version of signal Clk (e.g., an inverted control signal that is generated using inverter 16).

Configured in this way, clocked storage element 10 may serve to latch incoming data signals D in response to rising edges in signal Clk (assuming that signal Clk is a periodic clock signal and that both master and slave latches 12 and 14 are positive level-sensitive latching circuits). The input data may be latched at the output of element 10 at falling clock edges of signal Clk (in the example of FIG. 1). Clocked storage element 10 of this type is sometimes referred to as a digital flip-flop (FF) circuit or a register.

It may be desirable for a register to exhibit immunity to soft error upset (SEU) events (sometimes referred to as single event upsets). One way for a register to exhibit SEU immunity is for the master and slave latches (e.g., master latch 12 and slave latch 14 of FIG. 1) to be implemented using memory cell structures such as a memory cell structure of the type shown in FIG. 2.

Figure 2:
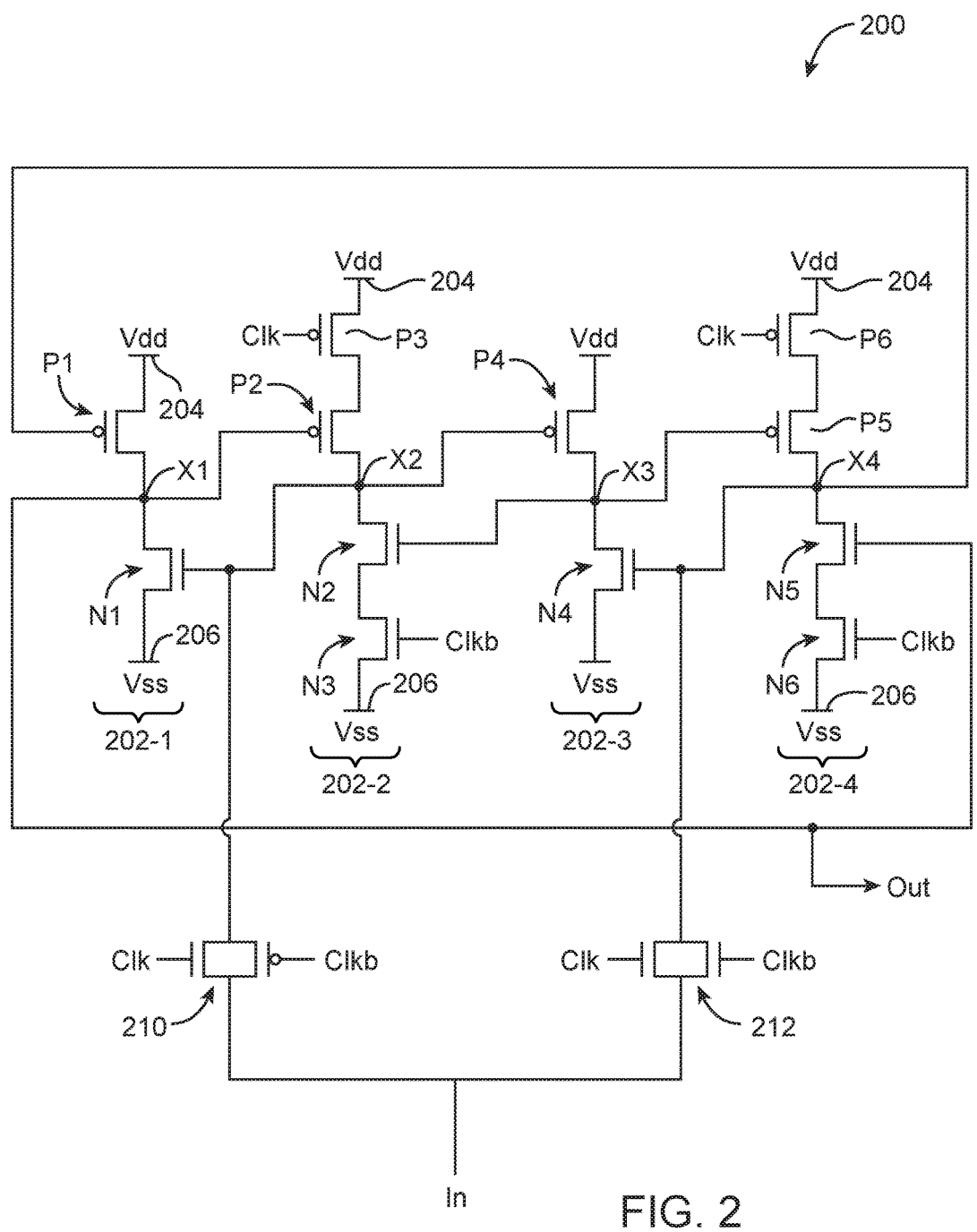
FIG. 2 is a circuit diagram of a dual interlocked cell (DICE) latch.

FIG. 2 is a circuit diagram of latch (or memory cell) circuit 200. As shown in FIG. 2, latch 200 includes first, second, third, and fourth inverting circuits 202 interconnected in a ring to form a bistable element. First inverting circuit 202-1 may include p-channel transistor P1 and n-channel transistor N1. Transistors P1 and N1 may be coupled between positive power supply line 204 (e.g., a positive power supply line on which positive power supply voltage Vdd is provided) and ground line 206 (e.g., a ground power supply line on which a ground voltage is supplied). Transistor P1 may have a source terminal that is connected to the positive power supply line. Transistor N1 may have a source terminal that is connected to the ground line. Transistors P1 and N1 may each have a drain terminal that is connected to an intermediate node X1.

Second inverting circuit 202-2 may include p-channel transistors P2 and P3 and n-channel transistors N2 and N3. Transistors P2 and P3 may be connected in series and may be coupled between positive power supply line 204 and an intermediate node X2. Transistors N2 and N3 may be connected in series with each other between intermediate node X2 and the ground line and may be connected in series with transistors P2 and P3.

Third inverting circuit 202-3 may include p-channel transistor P4 and n-channel transistor N4. Transistors P4 and N4 may be coupled in series between the positive power supply line and the ground line. Transistors P4 and N4 may have source terminals that are connected to the positive power supply line and the ground line, respectively. Transistors P4 and N4 may each have a drain terminal that is connected to an intermediate node X3.

Fourth inverting circuit 202-4 may include p-channel transistors P5 and P6 and n-channel transistors N5 and N6. Transistors P5 and P6 may be connected in series and may be coupled between the positive power supply line and an intermediate node X4. Transistors N5 and N6 may be connected in series and may be coupled between intermediate node X4 and the ground line. Transistors N5 and N6 may be connected in series with transistors P5 and P6.

Transistors P1-P6 may each have a body (bulk) terminal that is connected to an appropriate well bias such as positive power supply line 204. Transistors N1-N6 may each have a body terminal that is connected to an appropriate well bias such as ground line 206. Transistors P1, P2, P4, and P5 may have gate terminals that are connected to intermediate storage nodes X4, X1, X2, and X3, respectively. Transistors N1, N2, N4, and N5 may have gate terminals that are connected to storage nodes X2, X3, X4, and X1, respectively.

Transistors P3 and P6 may have gate terminals that are controlled by a true clock signal Clk. Transistors N3 and N6 may have gate terminals that are controlled by a complement clock signal Clkb (e.g., a signal that is an inverted version of the true clock signal). During normal operation of latch 200, signal Clk may be deasserted (e.g., true signal Clk may be low while the complement signal Clkb may be high) to enable the second and fourth inverting circuits to function properly.

During write operations, signal Clk may be asserted (e.g., true clock signal Clk may be driven high while complement clock signal Clkb may be low) to turn off transistors P3, P6, N3, and N6. Turning off transistors P3, P6, N3, and N6 breaks the pull-up and pull-down current paths of the second and fourth inverting circuits. Breaking the pull-up and pull-down current paths in this way allows nodes X2 and X4 to float, because no direct current path exists from the power supply lines to actively drive nodes X2 and X4. Transistors P3 and P6 may sometimes be referred to as tri-state pull-up transistors, whereas transistors N3 and N6 may sometimes be referred to as tri-state pull-down transistors. Asserting the clock signals during write operations to place the second and fourth inverting circuits in this tri-state mode (tri-stating the second and fourth inverting circuits) helps allow latch 200 to be more easily overwritten with a desired data value.

Latch 200 may include access circuits such as first transmission gate circuit 210 and second transmission gate circuit 212. First transmission gate circuit 210 may include an n-channel transistor and a p-channel transistor coupled in parallel between node X2 and input terminal In of latch 200. Similarly, second transmission gate circuit 212 can include an n-channel transistor and a p-channel transistor coupled in parallel between node X4 and input terminal In. The n-channel transistors of circuits 210 and 212 may receive signal Clk, whereas the p-channel transistors of circuits 210 and 212 may receive signal Clkb. Configured in this way, circuits 210 and 212 may be used during data loading operations to write desired data bits into latch 200.

Generally, any number of access and/or addressing circuits may be connected to any number of the intermediate nodes to provide desired read/write functionality and performance, if desired. Additional read (sensing) schemes (e.g., read circuits with different numbers of transistors, a differential read scheme that uses sense amplifiers, etc.) may be used, if desired.

The four inverting circuits 202 as arranged in FIG. 2 may serve as a memory storage portion that stores data for latch 200. The storage portion may store data (in true and complement form) on intermediate nodes X1-X4. Intermediate nodes X1-X4 may therefore be referred to as internal data storage nodes. Any of these nodes may be used as the output of latch 200. In the example of FIG. 2, node X1 may serve as output terminal Out for latch 200.

Latch 200 may exhibit bistable operation. When latch 200 has been loaded with a logic "0," the values of X1, X2, X3, and X4 will be "0," "1,", "0," and "1," respectively. When memory element has been loaded with a logic "1," the values of X1, X2, X3, and X4 will be "1," "0,", "1," and "0," respectively. In this context, the value stored at nodes X1 and X3 may represent a stored bit that currently retained by latched 200.

Unlike conventional memory element designs that are based on a pair of cross-coupled inverters, latch 200 of FIG. 2 includes four inverting circuits that are connected in a ring. In conventional cross-coupled inverter designs, there is a relatively strong likelihood that a radiation strike on an inverter's input node will cause the inverter's output to change states, thereby flipping the state of the latch to an erroneous value. In the arrangement of FIG. 2, the gate of the p-channel transistor (e.g., transistors P1, P2, P4, and P5) in each inverting circuit receives its input from a different source than the gate of the n-channel transistor in the same inverting circuit (e.g., transistors N1, N2, N4, and N5). Because the control signals for the gates of the transistors are distributed in this way, latch 200 is better able to recover from a radiation strike on a particular node without flipping its state than conventional memory elements based on cross-coupled inverters.

During normal operation, control signal Clk may be deasserted. As a result, transistors P3 and P6 are turned on while transistors N3 and N6 are turned on because signal Clkb is high. The second and fourth inverting circuits of latch 200 are therefore active, and latch 200 holds its loaded data value and exhibits immunity to radiation-induced upset events.

Consider, as an example, a situation in which node X1 and node X3 are low (at logic "0") and node X2 and node X4 are high (at logic "1"). If radiation strikes node X1, radiation-induced charge on node X1 may cause the voltage on node X1 to go high (e.g., to positive power supply voltage Vdd or even higher). When the voltage on node X1 goes high, transistor N5 in the fourth inverting circuit turns on. The voltage on node X3 is low, so transistor P5 is already on. With both transistor N5 and P5 on, the voltage on node X4 falls to about Vdd/2 (i.e., midway between positive power supply voltage Vdd and ground voltage Vss).

The high X1 voltage that was produced by the radiation strike is routed to the gate of transistor P2. This turns off transistor P2. Transistor N2 has a gate controlled by the signal on node X3. Because node X3 is low, transistor N2 is off. When transistor P2 is turned off while transistor N2 is off, node X2 is no longer directly connected to either positive power supply voltage Vdd on the positive power supply line or ground voltage Vss on the ground power supply line. Node X2 therefore floats, retaining its original high state, despite the radiation strike.

The unperturbed signal on node X2 serves as a control signal that is applied to the gate of transistor P4. Before the radiation strike, node X2 was high and transistor P4 was off. After the radiation strike, node X2 retains its original high state, so the state of transistor P4 is unchanged. Transistor N4 is controlled by a reduced high voltage (Vdd/2), but is able to hold node X3 low, because transistor P4 remains off. As with the unperturbed signal on node X2, the voltage on node X3 is therefore unperturbed by the radiation strike.

Because the voltage on node X3 remains low, transistor P5 remains on and pulls node X4 high. Even though node X4 is momentarily reduced in voltage from Vdd to Vdd/2, node X4 is still able to hold transistor P1 at least partially off, so that transistor N1, which is held on by unperturbed high signal on node X2, is able to pull node X1 low. Eventually, the radiation-induced charge on node X1 that momentarily elevated the voltage on node X1 will dissipate and node X1 will return to its normal (pre-strike) state of zero volts. Once X1 reaches zero volts, transistor N5 turns off and node X4 regains its pre-strike voltage of Vdd.

As this example demonstrates, the architecture of latch 200 allows the latch to retain its stored data value (a stored "0" in this example), even when a node in the latch is struck by radiation. The immunity of latch 200 to undesired changes in state from radiation strikes helps to ensure that the clocked storage element will exhibit stable operation in a variety of circumstances. Data storage nodes X1 and X3 may serve to store the same data value and may sometimes be referred to as a "redundant" node pair (e.g., node X3 may be redundant to node X1, or vice versa). Similarly, data storage nodes X2 and X4 may serve to store the same data value and may also be referred to as a redundant node pair (e.g., node X4 may be redundant to node X2, or vice versa). If only one node in a pair of redundant nodes is disturbed, then latch 200 will be capable of recovering from the disturbed state. The use of redundant nodes may therefore serve to enhance SEU performance. More or fewer than four inverting circuits may be used to form the bistable storage portion of latch 200, if desired. Latch 200 that includes four inverting circuits in the arrangement of FIG. 2 is sometimes referred to as a dual interlocked cell (DICE) memory element that demonstrates SEU immunity.

The circuit arrangement of FIG. 2 is sometimes referred to as a "SEU-hardened" latch circuit and is merely illustrative and does not serve to limit the scope of the present invention. If desired, latch 200 may include any number of inverting circuits (e.g., more than two inverting circuits, more than three inverting circuits, more than four inverting circuits, etc.), any type of access circuits, any suitable mechanism for enhancing SEU performance, etc. Registers implemented using such types of latches can therefore be referred to as hardened flip-flops.

Figure 3:
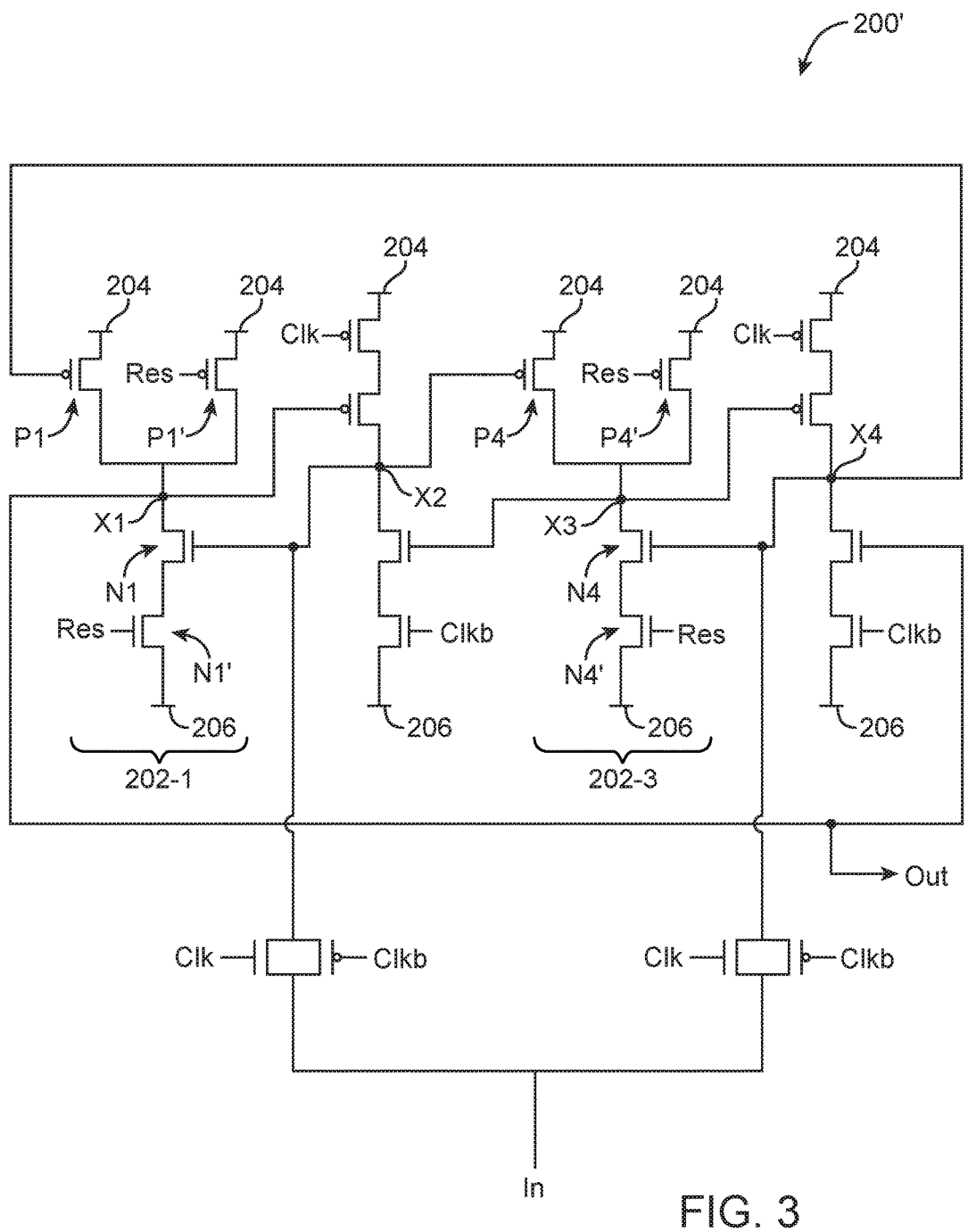
FIG. 3 is a circuit diagram of a DICE latch with asynchronous reset capabilities.

In additional to providing SEU immunity to clocked storage elements, it may sometimes be desirable to provide asynchronous reset capabilities. FIG. 3 is a circuit diagram of a DICE latch such as latch 200' with asynchronous reset capabilities. Latch 200' of FIG. 3, to a large extent, is fairly similar to latch 200 of FIG. 2. Elements that are the same as previously discussed elements are labeled with the same references in FIG. 2. The discussion of FIG. 3 can therefore be abbreviated and confined to just the significant differences from what has been previously explained.

As shown in FIG. 3, first inverting circuit 202-1 may include an additional n-channel transistor N1' that is connected in series with transistor N1 and an additional p-channel transistor P1' that is connected in parallel with transistor P1. Similarly, third inverting circuit 202-3 may include an additional n-channel transistor N4' that is connected in series with transistor N4 and an additional p-channel transistor P4' that is connected in parallel with transistor P4. Additional transistors N1', N4', P1', and P4' are controlled by reset signal Res. In this example, signal Res is an active low control signal. In other words, when signal Res is high, latch 200' may operate normally. However, when signal Res is driven low, the pull-down paths of both inverting circuits 202-1 and 202-3 are broken to allow p-channel transistors P1' and P4' to simultaneously pull storage noes X1 and X3 up towards Vdd. Configured in this way, signal Res may therefore be used to "preset" latch 200' to a logic "1." This is merely illustrative. The additional transistors can alternatively be added to inverting circuits 202-2 and 202-4 to instead reset or "clear" the state of latch 200' to a logic "0."

The addition of transistors N1', P1', N4', and P4' to create preset and/or clear functions, however, creates larger vulnerable areas for cell 200' and also reduces current drive of the inverting circuits (due to the stacking of transistors in the pull-down path), which can both increase the likelihood of an soft error upset and for the cell to enter metastability (since the regenerative feedback loop of the cell is weakened). As a result, cell 200' may exhibit a reduced mean time between failures (MTBF) value. It may therefore be desirable to provide an improved way of performing asynchronous reset on registers.

Figure 4:
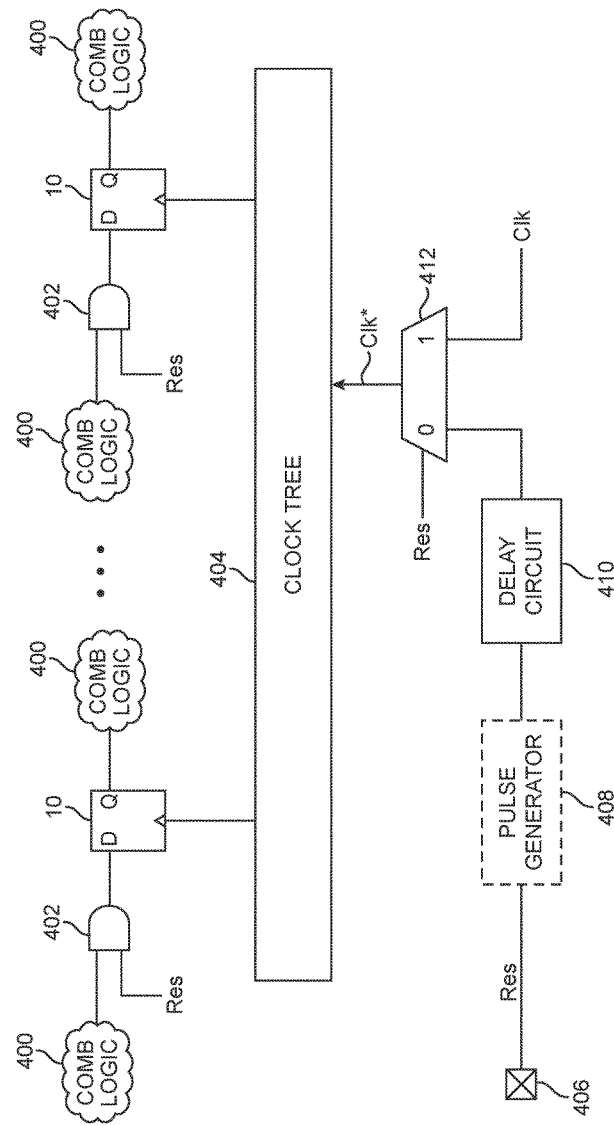
FIG. 4 is a diagram of illustrative registers with associated asynchronous reset control circuitry in accordance with an embodiment.

In accordance with an embodiment, an asynchronous reset can be added to one or more hardened flip-flops (e.g., registers implemented using latches of the type shown in FIG. 2, without the additional transistors of FIG. 3) with the addition of one logic gate per flip-flop and associated control circuitry at the input of the clock tree. FIG. 4 is a diagram of illustrative registers with associated asynchronous reset control circuitry. As shown in FIG. 4, each register 10 (e.g., a hardened register implemented using one or more DICE latches of FIG. 2) may be coupled between combinational logic 400 and may receive control signals via a clock distribution network such as clock tree 404. Clock tree 404 may be an H tree (an example) or other suitable types of clock mesh network.

A logic gate such as logic AND gate 402 may be inserted at the data input of each register 10. Gate 402 may have a first input that receives signal from associated combinational logic 400, a second input that receives asynchronous system reset signal Res, and an output that is connected to the data input of corresponding register 10.

A switching circuit such as multiplexer 412 may be connected at the input of clock tree 404. In particular, multiplexer 412 may have a control input that receives signal Res, a first (1) input that receives clock signal Clk, a second (0) input that receives a delayed version of signal Res, and an output that is coupled to clock tree 404. Signal Res may be supplied via an input-output pin such as external IO pad 406 of an integrated circuit on which the circuitry of FIG. 4 is formed. Externally supplied signal Res may be fed to the second input of multiplexer 410 via a delay element such as delay circuit 410. Delay circuit 410 may be configured to provide a predetermined or an adjustable amount of delay for signal Res. A pulse generating circuit such as pulse generator 408 may optionally be used to output a pulse signal in response to detecting an edge (e.g., either a falling edge and/or a rising edge) in signal Res.

While this implementation may add one gate delay to the data path (i.e., the additional gate delay associated with logic gate 402), no additional circuit element is connected to the storage feedback loop of the DICE latch, and no additional input pins are needed to control the reset function. Since logic gates 402, multiplexer 412, delay circuit 410, and pulse generator 408 (sometimes referred to collectively as asynchronous register reset control circuitry) are implemented outside registers 10 and therefore does not impact the regenerative feedback loop of the master/slave latches, the reset function implemented in the way shown in FIG. 4 does not affect the soft error or metastability of the hardened flip-flops 10.

Figure 5:
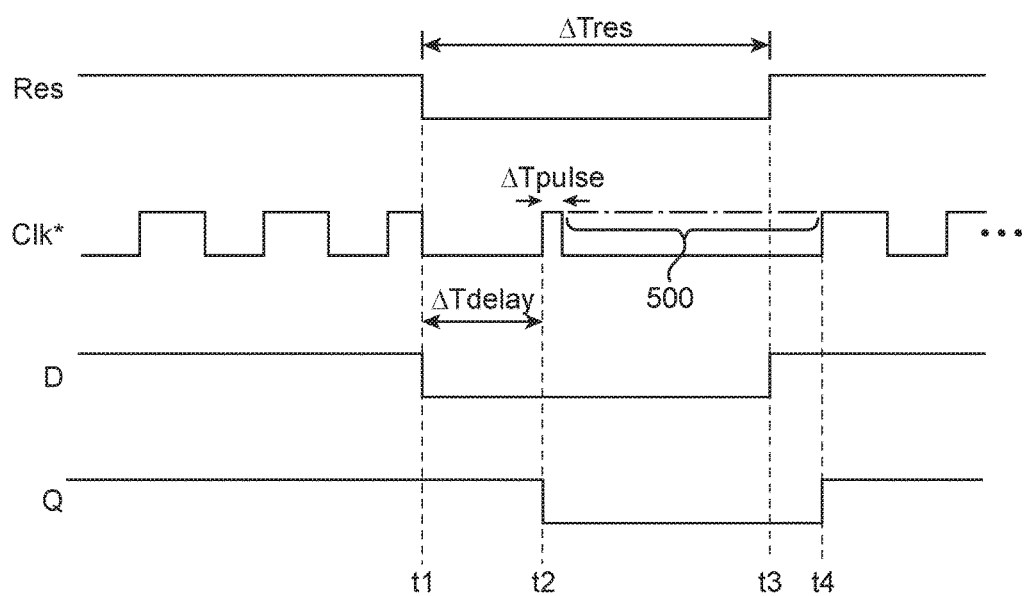
FIG. 5 is a timing diagram illustrating relevant signal waveforms associated with the operation of the asynchronous register reset control circuitry of FIG. 4 in accordance with an embodiment.

FIG. 5 is a timing diagram illustrating relevant signal waveforms associated with the operation of the asynchronous register reset control circuitry of FIG. 4. In particular, FIG. 5 shows asynchronous reset control signal Res, signal Clk* generated at the output of multiplexer 412, signal D at the input of register 10, and signal Q at the output of register 10.

Prior to time t1, active-low signal Res may be deasserted (i.e., signal Res may be driven high) and signals D and Q may both be driven high. At time t1, signal Res may be asserted (i.e., signal Res is driven low), which configures multiplexer 412 to pass through signals from its second (0) input. In the implementation that includes pulse generator 408, a logic zero may be provided to the second input of multiplexer 412 immediately following the assertion of signal Res, so signal Clk* is pulled lowed at time t1. By driving signal Res low, logic AND gate 402 will also drive signal D low at time t1.

In response to detecting a falling clock edge, pulse generator 408 may output a corresponding clock pulse signal. The clock pulse signal may be delayed by circuit 410 by time delay amount ΔTdelay. Delay circuit 410 may be configured such that duration ΔTdelay is at least greater than the sum of the time it takes signal Res to reach the data input of register 10 and the required setup time of register 10 (i.e., ΔTdelay>Tgate+Tsetup). This helps prevent register 10 from entering the metastable state during reset operations.

After delay amount ΔTdelay following time t1, the clock pulse signal with a pulse width of ΔTpulse may arrive at the output of multiplexer 412 and may consequently trigger register 10 to latch the reset value at its input (at time t2). As a result, data output Q is pulled low. Pulse generator 408 may be configured such that the generated pulse width ΔTpulse is greater than the required hold time of register 10 (i.e., ΔTpulse>Thold). This also helps prevent register 10 from entering the metastable state during reset. If pulse generator 408 were not used, signal Clk* may remain high for the remaining duration of the reset period, as indicated by dotted line 500.

At time t3, signal Res may be driven back high, which drives data input D back high. The total duration for which signal Res is asserted is represented by reset pin assertion time ΔTres from time t2 to time t3. In general, duration ΔTres may be set to be at least greater than the delay of circuit 410 and the pulse width of the clock pulse signal (i.e., ΔTres>ΔTdelay+ΔTpulse). This helps ensure that reset signal Res can be clocked into register 10. At time t4, signal Clk may again be allowed to clock register 10 during normal operation of the integrated circuit (i.e., during non-reset operations).

Figure 6:
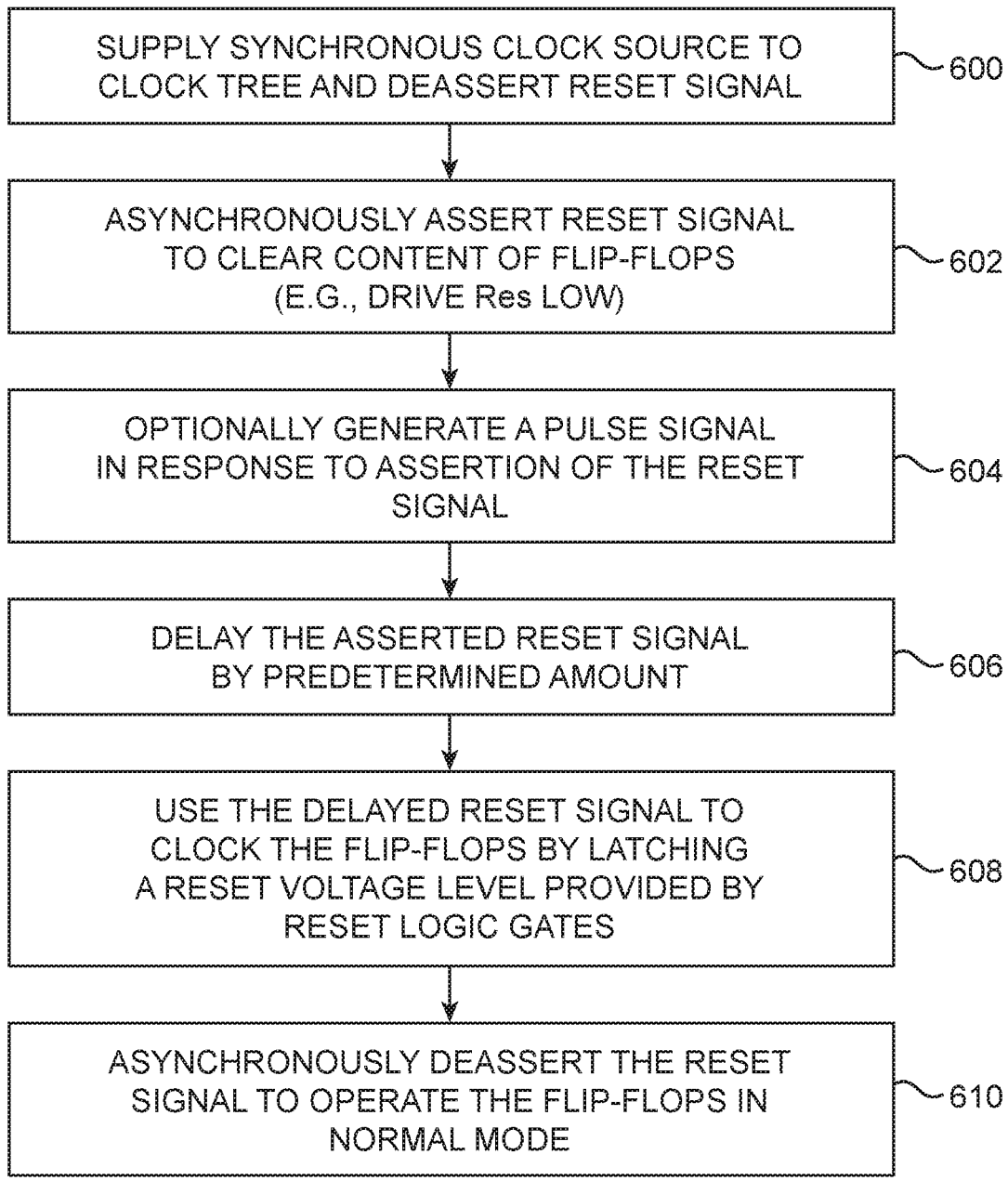
FIG. 6 is a flow chart of illustrative steps for operating register reset control circuitry in accordance with an embodiment.

FIG. 6 is a flow chart of illustrative steps for operating register reset control circuitry in accordance with an embodiment. At step 600, a synchronous clock source may supply signal Clk to clock tree 404 while signal Res remains deasserted (e.g., while signal Res is high).

At step 602, signal Res may be asynchronously asserted (e.g., signal Res may be pulled low) to clear the contents of registers 10. At step 604, pulse generator 408 may optionally be used to generate a clock pulse signal in response to detecting assertion of signal Res. At step 606, the clock pulse signal may be delayed by a predetermined amount.

At step 608, the delayed clock pulse signal may be used to clock registers 10 by latching a reset voltage level provided by reset logic gates 402. At the end of the reset operation, signal Res may be asynchronously deasserted (e.g., signal Res may be pulled back high) to operated registers 10 in normal mode (step 610).

These steps are merely illustrative. The existing steps may be modified or omitted; some of the steps may be performed in parallel; additional steps may be added; and the order of certain steps may be reversed or altered.

The methods and circuitry described above are merely illustrative and does not serve to limit the scope of the present invention. If desired, the techniques described above may be used to preset flip-flops (e.g., to set output Q of all registers 10 to logic ones instead of clearing them to logic zeroes) on any suitable type of integrated circuits. If desired, the reset control circuitry of FIG. 4 can be modified to support both reset and preset operations without affecting the SEU immunity and metastability of the hardened flip-flops.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The foregoing is merely illustrative of the principles of this invention and various modifications can be made by those skilled in the art. The foregoing embodiments may be implemented individually or in any combination.

What is claimed is:

1. Circuitry, comprising:
   a register having a clock input;
   a clock tree that is coupled to the clock input of the register; and
   a switching circuit having inputs that receive a clock signal and an asynchronous reset signal and an output that is coupled to the clock tree, the switching circuit comprises a multiplexer, and the multiplexer having a control input that receives the asynchronous reset signal and a data input that receives a delayed version of the asynchronous reset signal.

2. The circuitry of claim 1, wherein the register comprises a flip-flop.

3. The circuitry of claim 2, wherein the flip-flop is immune to soft error upsets.

4. The circuitry of claim 1, wherein the multiplexer further includes an additional data input that receives the clock signal.

5. The circuitry of claim 4, further comprising:
   a delay circuit that is coupled to the second input of the multiplexer.

6. The circuitry of claim 4, further comprising:
   a pulse generator that is coupled to the second input of the multiplexer.

7. The circuitry of claim 6, wherein the pulse generator is configured to generate a clock pulse signal in response to detecting an edge in the asynchronous reset signal.

8. The circuitry of claim 1, further comprising:
   a logic gate inserted at a data input of the register.

9. The circuitry of claim 8, further comprising:
   combinational logic, wherein the logic gate has a first input that is connected to the combinational logic, a second input that receives the asynchronous reset signal, and an output that is connected to the data input of the register.

10. A method of operating an integrated circuit, comprising:
    using a register to store data;
    using a clock tree to supply a control signal to a clock input of the register;
    with a switching circuit, receiving a clock signal and an asynchronous reset signal and outputting the control signal to the clock tree; and
    with a logic gate, receiving user signals and the asynchronous reset signal and selectively outputting a reset value to the register when the asynchronous reset signal is asserted.

11. The method of claim 10, wherein the switching circuit comprises a multiplexer, and wherein receiving the clock signal and the asynchronous reset signal comprises:
    receiving the asynchronous reset signal at a control input of the multiplexer;
    receiving the clock signal at a first data input of the multiplexer; and
    receiving a delayed version of the asynchronous reset signal at a second data input of the multiplexer.

12. The method of claim 11, further comprising:
    with a delay circuit, delaying the asynchronous reset signal and outputting the delayed version of the asynchronous reset signal to the second data input of the multiplexer.

13. The method of claim 10, further comprising:
    with a pulse generator, outputting a pulse signal in response to detecting an edge in the asynchronous reset signal.

* * * * *